United States Patent
Adlakha et al.

(10) Patent No.: US 11,799,480 B1
(45) Date of Patent: Oct. 24, 2023

(54) SCALABLE SUPPLY MULTIPLEXER CIRCUIT

(71) Applicant: Synopsys, Inc., Mountain View, CA (US)

(72) Inventors: Akshay Adlakha, Boston, MA (US); Hiten Advani, New Delhi (IN)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 17/542,111

(22) Filed: Dec. 3, 2021

(51) Int. Cl.
| | |
|---|---|
| *H03K 3/012* | (2006.01) |
| *H03K 3/356* | (2006.01) |
| *H03K 17/16* | (2006.01) |
| *H03K 17/687* | (2006.01) |
| *H02M 3/335* | (2006.01) |
| *H03K 19/0185* | (2006.01) |

(52) U.S. Cl.
CPC ............... *H03K 19/018521* (2013.01)

(58) Field of Classification Search
None
See application file for complete search history.

(56) References Cited

U.S. PATENT DOCUMENTS

| | | | | | |
|---|---|---|---|---|---|
| 5,966,043 | A | * | 10/1999 | Jinbo | H03K 17/693 327/434 |
| 7,265,605 | B1 | * | 9/2007 | Vasudevan | G05F 1/56 327/534 |
| 9,479,154 | B2 | * | 10/2016 | Matsuoka | H03K 3/35613 |
| 9,685,203 | B2 | * | 6/2017 | Huang | G11C 17/16 |
| 10,103,626 | B1 | * | 10/2018 | Narayanan | H03K 19/0008 |

\* cited by examiner

*Primary Examiner* — Kenneth B Wells

(74) *Attorney, Agent, or Firm* — Park, Vaughan, Fleming & Dowler LLP; Laxman Sahasrabuddhe

(57) ABSTRACT

A circuit to multiplex supply voltages may include a set of chains of transistors. Each chain of transistors may correspond to a voltage supply that is desired to be multiplexed and may include a set of transistors coupled in series. A first end terminal of each chain of transistors may be coupled to a corresponding voltage supply, and a second end terminal of each chain of transistors may be coupled to an output terminal of the circuit. A given supply voltage may be selected by turning on transistors in a chain of transistors that corresponds to the given supply voltage and turning off transistors in other chains of transistors.

17 Claims, 5 Drawing Sheets

US 11,799,480 B1

SCALABLE SUPPLY MULTIPLEXER CIRCUIT

TECHNICAL FIELD

The present disclosure relates to an integrated circuit (IC) design. More specifically, the present disclosure relates to a scalable supply multiplexer circuit.

BACKGROUND

Advances in process technology and an almost unlimited appetite for computing and storage have fueled a rapid increase in the size and complexity of IC designs. IC designs may include multiple voltage supplies.

SUMMARY

Embodiments described herein may feature a circuit that may include a multiplexed voltage supply terminal and a set of chains of transistors. Each chain of transistors may include a set of transistors coupled in series and may correspond to a voltage supply that is desired to be multiplexed. A first end terminal of each chain of transistors may be coupled to a corresponding voltage supply, and a second end terminal of each chain of transistors may be coupled to the multiplexed voltage supply terminal.

Some embodiments described herein may include sets of level shifters, where each set of level shifters may be controlled by a select signal corresponding to a voltage supply that is desired to be multiplexed. A given set of level shifters may include a first level shifter that outputs the voltage supply voltage (which is the supply voltage that is provided as input to the first level shifter) or a ground voltage based on the select signal, and a second level shifter that outputs the multiplexed voltage supply terminal voltage (which is the multiplexed supply voltage that is outputted by the supply multiplexer) or a ground voltage based on the select signal. In some embodiments described herein, an output of the first level shifter may be coupled with a gate of a first end transistor in the chain of transistors corresponding to the voltage supply, and an output of the second level shifter may be coupled with a gate of a second end transistor in the chain of transistors corresponding to the voltage supply.

In some embodiments described herein, body terminals of end transistors in each chain of transistors may be coupled to respective end terminals of the chain of transistors. In some embodiments described herein, the sets of chains of transistors includes positive-type metal-oxide-semiconductor (PMOS) transistors. In some embodiments described herein, the sets of chains of transistors includes negative-type metal-oxide-semiconductor (NMOS) transistors.

In some embodiments described herein, asserting a select signal that corresponds to a voltage supply may cause transistors in a chain of transistors that corresponds to the voltage supply to turn on and transistors in other chains of transistors that do not correspond to the voltage supply to turn off.

BRIEF DESCRIPTION OF THE FIGURES

The disclosure can be understood based on the detailed description given below and the accompanying figures. The figures are for illustrative purposes, and do not limit the scope of the disclosure. Furthermore, the figures are not necessarily drawn to scale.

DETAILED DESCRIPTION

An analog circuit design may need to multiplex the power supply of an analog circuit block between two or more power supplies. Such a multiplexing feature may be used to save power or to improve performance of the circuit design. In some approaches, PMOS devices may be used for multiplexing power supplies. A PMOS device may be constructed by creating an n-well (which is a region of a n-doped semiconductor) within a p-type substrate. P-type source and drain regions may be created within the n-well. The junction between the p-type substrate and the n-well may be referred to as a n-well diode. The n-well diode is desired to be maintained in the off state, e.g., by maintaining a reverse bias voltage across the n-well diode. Moreover, regardless of a supply voltage that is selected at any given time, it is desirable to reduce the leakage current from one supply node to another supply node. A voltage drop (which may be referred to as an IR drop) may occur across each PMOS device that is in the path between an input terminal and the output terminal of the multiplexing circuitry. It is desirable to reduce the total voltage drop between an input terminal (which may receive an input supply voltage) and the output terminal (which may provide a multiplexed supply voltage to a circuit).

In some situations, the supply voltages that are being multiplexed may have a wide range and may vary independently of each other. Some circuits that switch or multiplex the power supply between these different supply voltages may suffer from n-well biasing problems, e.g., a supply voltage may cause the n-well diode to turn on and/or leak a large amount of current from one supply node to another supply node. Some embodiments described herein can multiplex between multiple supply voltages by using chains of transistors, where each chain of transistors includes only two transistors even when the number of supply voltages being multiplexed is greater than two.

Embodiments described herein feature circuitry that can multiplex between a wide range of power supply voltages without n-well biasing problems, without large leakage currents, and without incurring a large voltage drop between the voltage supply input terminals and the output terminal of the multiplexing circuitry (the voltage drop is reduced because some embodiments use only two transistors in the path between a voltage supply input terminal and the output terminal). In other words, embodiments described herein ensure that that the n-well diode does not turn on (i.e., these embodiments do not suffer from n-well biasing problems), and the leakage current in the embodiments described herein is very low (e.g., almost zero). The embodiments described herein can be scaled to any desired number of supply voltages (e.g., more than two supply voltages).

Figure 1:
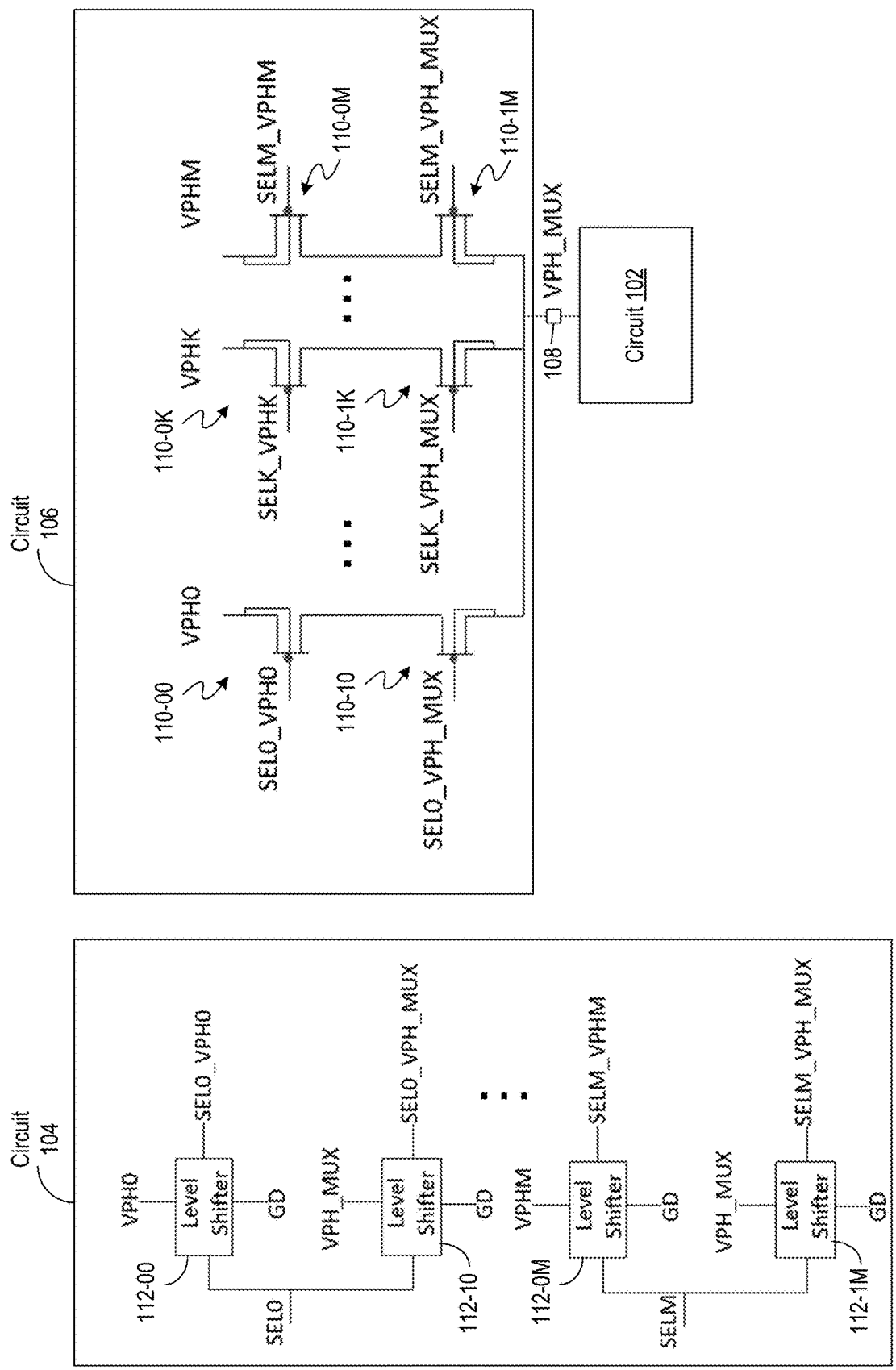
FIG. 1 illustrates a supply multiplexer circuit that uses chains of PMOS transistors to multiplex between multiple supply voltages in accordance with some embodiments described herein.

FIG. 1 illustrates a supply multiplexer circuit that uses chains of PMOS transistors to multiplex between multiple supply voltages in accordance with some embodiments described herein.

The supply multiplexer circuit shown in FIG. 1 may multiplex between multiple power supply voltages VPH0, ..., VPHK, and VPHM. Specifically, the supply multiplexer circuit may include circuit 104 and 106. Circuit 104 may generate gate voltages for PMOS transistors in circuit 106, which may cause circuit 106 to select a desired voltage supply from a set of voltage supplies (e.g., VPH0 through VPHM) to output at terminal 108. The voltage supply outputted at terminal 108 is shown as "VPH_MUX" in FIG. 1. Circuit 102 may operate using a voltage supply that is outputted by circuit 106 at terminal 108. In other words, the supply multiplexer circuit shown in FIG. 1 may couple a power supply terminal of circuit 102 with a voltage supply selected from a set of voltage supplies (e.g., VPH0 through VPHM).

Circuit 106 may include multiple chains of PMOS transistors. Each chain of PMOS transistors may include at least two PMOS transistors coupled in series (e.g., the drain of one PMOS transistor may be electrically connected to the source of the other PMOS transistor). In some embodiments described herein, circuit 106 may include a chain of PMOS transistors for each voltage supply that is desired to be multiplexed. For example, circuit 106 may include a first chain of PMOS transistors 110-00 and 110-10 corresponding to voltage supply VPH0, a second chain of PMOS transistors 110-0K and 110-1K corresponding to voltage supply VPHK, and a third chain of PMOS transistors 110-0M and 110-1M corresponding to voltage supply VPHM.

One end of each chain of PMOS transistors may be coupled to a voltage supply, and the other end of the chain of PMOS transistors may be coupled to a multiplexer output terminal, e.g., terminal 108. For example, the source of PMOS transistor 110-00 is electrically connected to VPH0, the drain of PMOS transistor 110-00 is electrically connected to the source of PMOS transistor 110-10, and the drain of PMOS transistor 110-10 is electrically connected to terminal 108.

The body terminals of the end PMOS transistors in the chain of PMOS transistors may be electrically connected to the respective end terminal of the chain of PMOS transistors. For example, the body terminal of PMOS transistor 110-00 may be electrically connected to VPH0, and the body terminal of PMOS transistor 110-10 may be electrically connected to terminal 108.

When a particular power supply is desired to be selected by the multiplexer circuit shown in FIG. 1, then all PMOS transistors in the corresponding chain of PMOS transistors may be turned on, and at least one PMOS transistor in each of the other chains of PMOS transistors may be turned off.

In some embodiments, a set of select signals, e.g., SEL0 through SELM, may be used to select the supply voltage. At any given time, only one of the select signals may be enabled. In this disclosure, a select signal is enabled if the select signal causes a corresponding supply voltage to be outputted as the multiplexed supply voltage. For example, at any given time, only one of the select signals may be a logic "0" (where a logic "0" causes a PMOS transistor to turn on) and the other select signals may be logic "1."

Each select signal may be provided to a pair of level shifters. For example, select signal SEL0 may be provided to level shifters 112-00 and 112-10, ..., and select signal SELM may be provided to level shifters 112-0M and 112-1M. Each level shifter may receive a supply voltage and a ground voltage. For example, level shifter 112-00 receives supply voltage VPH0 and ground voltage GD, level shifter 112-10 receives supply voltage VPH_MUX and ground voltage GD, ..., level shifter 112-0M receives supply voltage VPHM and ground voltage GD, and level shifter 112-1M receives supply voltage VPH_MUX and ground voltage GD.

When a select signal is enabled (e.g., the select signal is a logic "0"), the output voltage of the corresponding level shifter may be equal to the ground voltage, and when the select signal is disabled (e.g., the select signal is a logic "1"), the output voltage of the level shifter may be equal to the supply voltage. In FIG. 1, the output of level shifter 112-00 is SEL0_VPH0, the output of level shifter 112-10 is SEL0 VPH_MUX, ..., the output of level shifter 112-0M is SELM_VPHM, and the output of level shifter 112-1M is SELM_VPH_MUX.

For example, when SEL0=0, the SEL0_VPH0 output of level shifter 112-00 and the SEL0 VPH_MUX output of level shifter 112-10 may output the ground voltage GD. Conversely, when SEL0=1, the SEL0_VPH0 output of level shifter 112-00 may output the supply voltage VPH0 and the SEL0 VPH_MUX output of level shifter 112-00 may output the supply voltage VPH_MUX.

Each level shifter may also have a complementary output (not shown in FIG. 1) that outputs a voltage that is opposite of the primary output (e.g., opposite of SEL0_VPH0, SEL0 VPH_MUX, and so forth). Thus, if the primary output of the level shifter is outputting a ground voltage, then the complementary output may output a power supply voltage, and vice versa.

The output signals from the level shifters may be provided to the gate terminals of the PMOS transistors as shown in FIG. 1. For example, the SEL0_VPH0 and SEL0 VPH_MUX output signals may be provided to the gates of the PMOS transistors 110-00 and 110-10, respectively.

Figure 2:
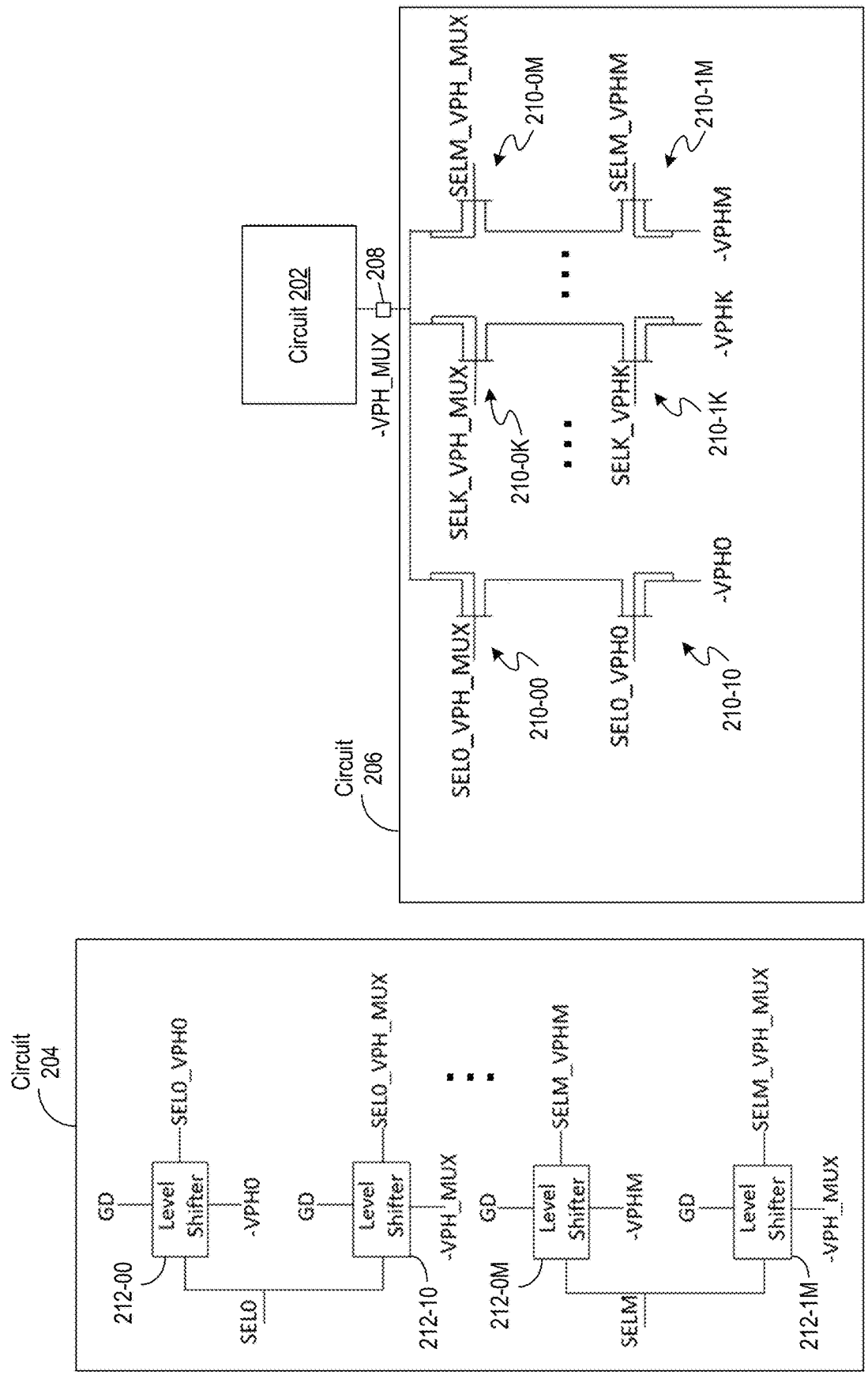
FIG. 2 illustrates a supply multiplexer circuit that uses chains of NMOS transistors to multiplex between multiple supply voltages in accordance with some embodiments described herein.

FIG. 2 illustrates a supply multiplexer circuit that uses chains of NMOS transistors to multiplex between multiple supply voltages in accordance with some embodiments described herein.

The supply multiplexer circuit shown in FIG. 2 has a complementary structure with respect to the supply multiplexer circuit shown in FIG. 1. The supply multiplexer circuits shown in FIGS. 1 and 2 may be used to multiplex between supply voltages with a positive polarity and a negative polarity, respectively.

Specifically, the supply multiplexer circuit shown in FIG. 2 may multiplex between multiple power supply voltages −VPH0, ..., −VPHK, and −VPHM. The negative sign before a voltage value, e.g., "−VPH0," refers to the fact that the supply voltage has a negative polarity, e.g., −5V. The supply multiplexer circuit may include circuit 204 and 206. Circuit 204 may generate gate voltages for NMOS transistors in circuit 206, which may cause circuit 206 to select a desired voltage supply from a set of voltage supplies (e.g., −VPH0 through −VPHM) to output at terminal 208. The voltage supply outputted at terminal 208 is shown as "−VPH_MUX" in FIG. 2. Circuit 202 may operate using a voltage supply that is outputted by circuit 206 at terminal 208. In other words, the supply multiplexer circuit shown in FIG. 2 may couple a power supply terminal of circuit 202 with a voltage supply selected from a set of voltage supplies (e.g., −VPH0 through −VPHM).

Circuit 206 may include multiple chains of NMOS transistors. Each chain of NMOS transistors may include two NMOS transistors coupled in series (e.g., the drain of one NMOS transistor may be electrically connected to the source of the other NMOS transistor). In some embodiments described herein, circuit 206 may include a chain of NMOS transistors for each voltage supply that is desired to be multiplexed. For example, circuit 206 may include a first chain of NMOS transistors 210-00 and 210-10 corresponding to voltage supply −VPH0, a second chain of NMOS transistors 210-0K and 210-1K corresponding to voltage supply −VPHK, and a third chain of NMOS transistors 210-0M and 210-1M corresponding to voltage supply −VPHM.

One end of each chain of NMOS transistors may be coupled to a voltage supply, and the other end of the chain of NMOS transistors may be coupled to the multiplexer output terminal, e.g., terminal 208. For example, the source of NMOS transistor 210-00 is electrically connected to −VPH0, the drain of NMOS transistor 210-00 is electrically connected to the source of NMOS transistor 210-10, and the drain of NMOS transistor 210-10 is electrically connected to terminal 208.

The body terminals of the end NMOS transistors in the chain of NMOS transistors may be electrically connected to the respective end terminal of the chain of NMOS transistors. For example, the body terminal of NMOS transistor 210-00 may be electrically connected to −VPH0, and the body terminal of NMOS transistor 210-10 may be electrically connected to terminal 208.

When a particular power supply is desired to be selected by the multiplexer circuit shown in FIG. 2, then all NMOS transistors in the corresponding chain of NMOS transistors may be turned on, and at least one NMOS transistor in each of the other chains of NMOS transistors may be turned off.

In some embodiments, a set of select signals, e.g., SEL0 through SELM, may be used to select the supply voltage. At any given time, only one of the select signals may be enabled. For example, at any given time, only one of the select signals may be a logic "1" (where a logic "1" causes an NMOS transistor to turn on) and the other select signals may be logic "0s."

Each select signal may be provided to a pair of level shifters. For example, select signal SEL0 may be provided to level shifters 212-00 and 212-10, . . . , and select signal SELM may be provided to level shifters 212-0M and 212-1M. Each level shifter may receive a supply voltage and a ground voltage. For example, level shifter 212-00 receives supply voltage −VPH0 and ground voltage GD, level shifter 212-10 receives supply voltage −VPH_MUX and ground voltage GD, . . . , level shifter 212-0M receives supply voltage −VPHM and ground voltage GD, and level shifter 212-1M receives supply voltage −VPH_MUX and ground voltage GD.

When a select signal is enabled (e.g., the select signal is a logic "1"), the output voltage of the corresponding level shifter may be equal to the ground voltage, and when the select signal is disabled (e.g., the select signal is a logic "0"), the output voltage of the level shifter may be equal to the supply voltage. In FIG. 2, the output of level shifter 212-00 is SEL0_VPH0, the output of level shifter 212-10 is SEL0 VPH_MUX, . . . , the output of level shifter 212-0M is SELM_VPHM, and the output of level shifter 212-1M is SELM_VPH_MUX.

For example, when SEL0=1, the SEL0_VPH0 output of level shifter 212-00 and the SEL0 VPH_MUX output of level shifter 212-10 may output the ground voltage GD. Conversely, when SEL0=0, the SEL0_VPH0 output of level shifter 212-00 may output the supply voltage −VPH0 and the SEL0 VPH_MUX output of level shifter 212-00 may output the supply voltage −VPH_MUX.

Each level shifter may also have a complementary output (not shown in FIG. 2) that outputs a voltage that is opposite of the primary output (e.g., opposite of SEL0_VPH0, SEL0 VPH_MUX, and so forth). Thus, if the primary output of the level shifter is outputting a ground voltage, then the complementary output may output a power supply voltage, and vice versa.

The output signals from the level shifters may be provided to the gate terminals of the NMOS transistors as shown in FIG. 2. For example, the SEL0_VPH0 and SEL0 VPH_MUX output signals may be provided to the gates of the NMOS transistors 210-00 and 210-10, respectively.

Figure 3:
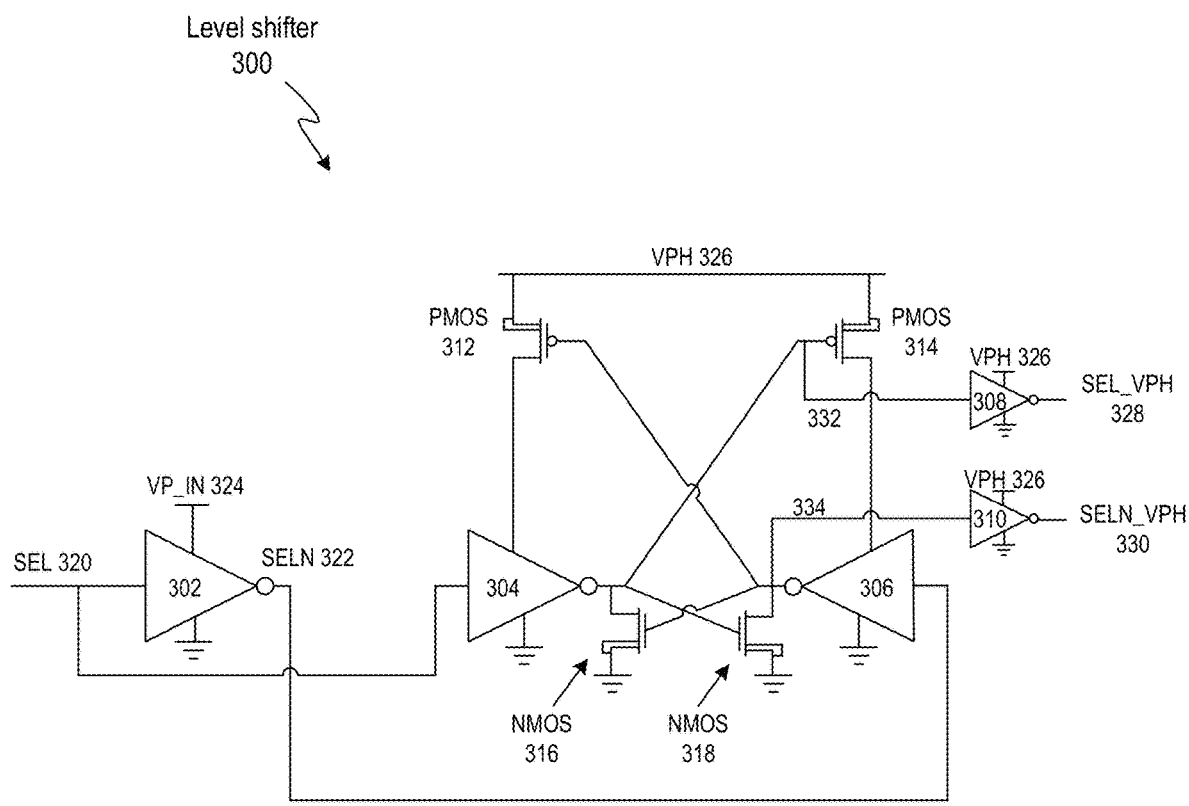
FIG. 3 illustrates a level shifter circuit in accordance with some embodiments described herein.

FIG. 3 illustrates a level shifter circuit in accordance with some embodiments described herein. Level shifter circuit 300 may include inverters 302, 304, 306, 308, and 310, PMOS transistors 312 and 314, and NMOS transistors 316 and 318. VP_IN 324 is the input supply voltage and VPH 326 is the output supply voltage. Supply voltage VP_IN 324 is used by inverter 302, and supply voltage VPH 326 is used by inverters 304, 306, 308, and 310, PMOS transistors 312 and 314, and NMOS transistors 316 and 318. Level shifter 300 converts logic signal SEL 320 defined in supply voltage VP_IN 324 into an equivalent logic signal SEL_VPH 328 defined in supply voltage VPH 326. Logic signals SELN 322 and SELN_VPH 330 are inverted versions of logic signals SEL 320 and SEL_VPH 328, respectively. Level shifter circuit 300 may correspond to level shifter 112-00 in FIG. 1, where logic signal SEL0 in FIG. 1 may correspond to logic signal SEL 320, supply voltage VPH0 in FIG. 1 may correspond to supply voltage VPH 326, and logic signal SEL0_VPH0 in FIG. 1 may correspond to logic signal SEL_VPH 328.

When SEL 320 is a logic 1 and has voltage VP_IN 324, it may turn off NMOS 318 and turn on NMOS 316, which may cause signal 332 to be a logic 0 and the output of inverter 308 to be a logic 1 in the VPH 326 supply voltage domain. Thus, when SEL 320 is a logic 1 and has voltage VP_IN 324, level shifter 300 may cause (1) SELN 322 to be a logic 0 and have a ground voltage, (2) SEL_VPH 328 to be a logic 1 and have voltage VPH 326, and (3) SELN_VPH 330 to be a logic 0 and have a ground voltage.

When SEL 320 is a logic 0 and has a ground voltage, it may turn on NMOS 318 and turn off NMOS 316, which may cause signal 332 to be a logic 1 and the output of inverter 308 to be a logic 0 in the VPH 326 supply voltage domain. Thus, when SEL 320 is a logic 0 and has a ground voltage, level shifter 300 may cause (1) SELN 322 to be a logic 1 and have voltage VP_IN 324, (2) SEL_VPH 328 to be a logic 0 and have a ground voltage, and (3) SELN_VPH 330 to be a logic 1 and have voltage VPH 326.

Figure 4:
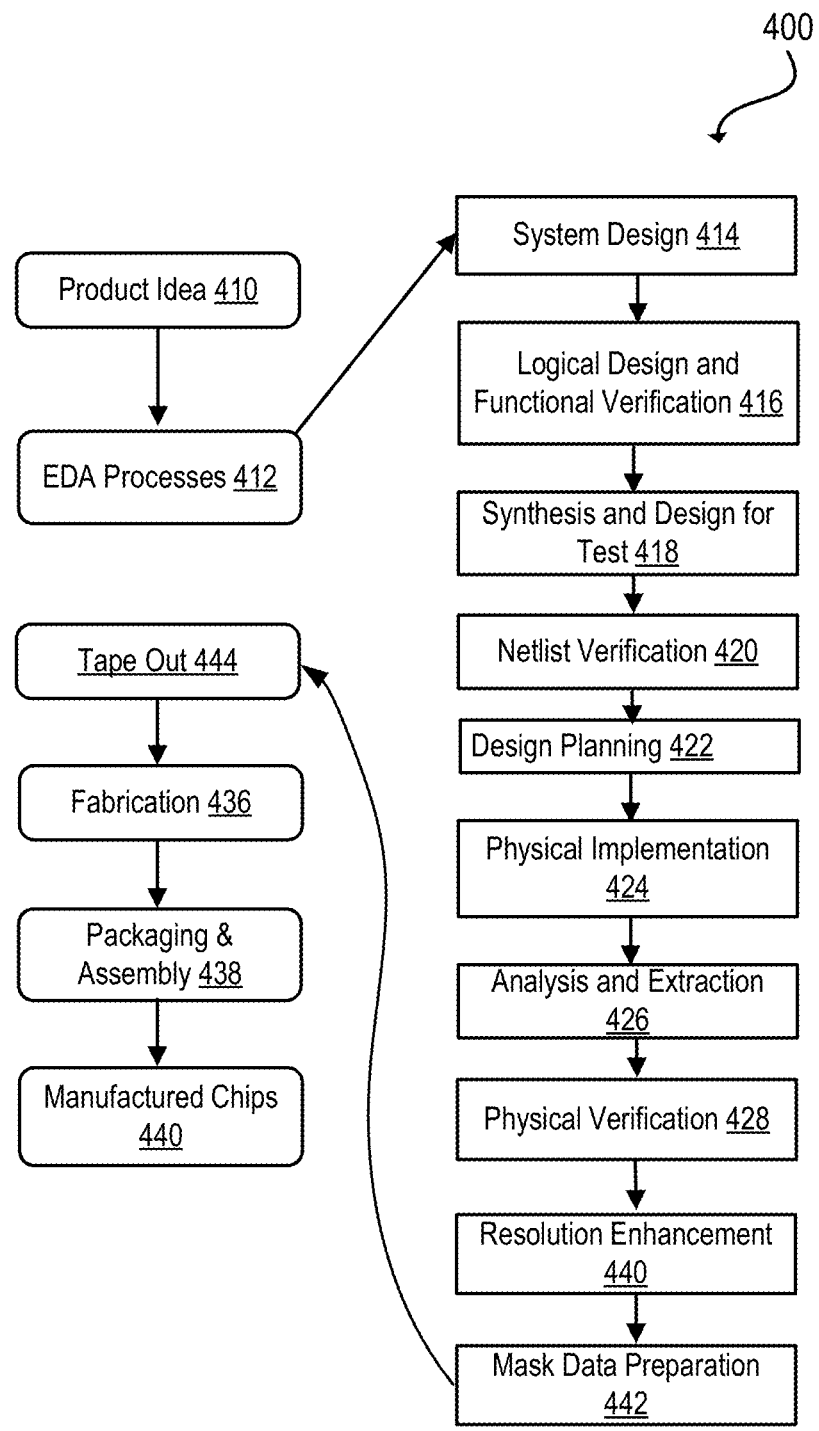
FIG. 4 illustrates an example flow for the design, verification, and fabrication of an integrated circuit in accordance with some embodiments described herein.

FIG. 4 illustrates an example flow 400 for the design, verification, and fabrication of an integrated circuit in accordance with some embodiments described herein. EDA processes 412 (the acronym "EDA" refers to "Electronic Design Automation") can be used to transform and verify design data and instructions that represent the integrated circuit. Each of these processes can be structured and enabled as multiple modules or operations.

Flow 400 can start with the creation of a product idea 410 with information supplied by a designer, information which is transformed and verified by using EDA processes 412. When the design is finalized, the design is taped-out 434, which is when artwork (e.g., geometric patterns) for the integrated circuit is sent to a fabrication facility to manufacture the mask set, which is then used to manufacture the integrated circuit. After tape-out, a semiconductor die is fabricated 436 and packaging and assembly 438 are performed to produce the manufactured IC chip 440.

Specifications for a circuit or electronic structure may range from low-level transistor material layouts to high-level description languages. A high-level of representation may be used to design circuits and systems, using a hardware description language ("HDL") such as VHDL, Verilog, SystemVerilog, SystemC, MyHDL or OpenVera. The HDL description can be transformed to a logic-level register transfer level ("RTL") description, a gate-level description, a layout-level description, or a mask-level description. Each lower representation level that is a more concrete description adds more detail into the design description. The lower levels of representation that are more concrete descriptions can be generated by a computer, derived from a design library, or created by another design automation process. An example of a specification language at a lower level of representation language for specifying more detailed descriptions is SPICE (which stands for "Simulation Program with Integrated Circuit Emphasis"). Descriptions at each level of representation contain details that are sufficient for use by the corresponding tools of that layer (e.g., a formal verification tool).

During system design 414, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 416, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 418, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 420, the netlist is checked for compliance with timing constraints and for correspondence with the HDL code. During design planning 422, an overall floor plan for the integrated circuit is constructed and analyzed for timing and top-level routing.

During layout or physical implementation 424, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 426, the circuit function is verified at the layout level, which permits refinement of the layout design. During physical verification 428, the layout design is checked to ensure that manufacturing constraints are correct, such as DRC constraints, electrical constraints, lithographic constraints, and that circuitry function matches the HDL design specification. During resolution enhancement 430, the geometry of the layout is transformed to improve how the circuit design is manufactured.

During tape-out, data is created to be used (after lithographic enhancements are applied if appropriate) for production of lithography masks. During mask data preparation 432, the 'tape-out' data is used to produce lithography masks that are used to produce finished integrated circuits.

A storage subsystem of a computer system (such as computer system 500 of FIG. 5) may be used to store the programs and data structures that are used by some or all of the EDA products described herein, and products used for development of cells for the library and for physical and logical design that use the library.

Figure 5:
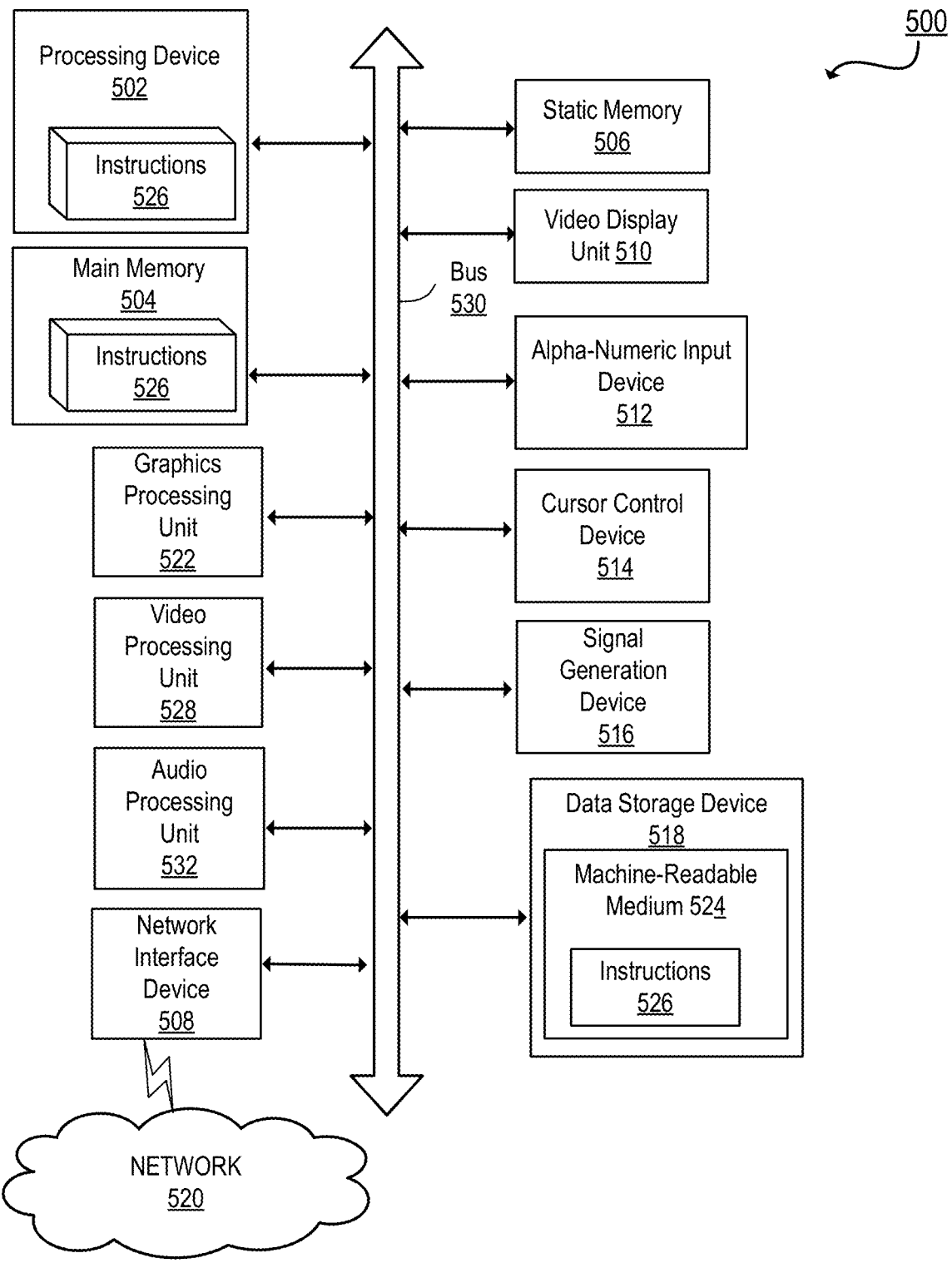
FIG. 5 illustrates an example machine of a computer system within which a set of instructions, for causing the machine to perform any one or more of the methodologies discussed herein, may be executed.

FIG. 5 illustrates an example machine of a computer system 500 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM), a static memory 506 (e.g., flash memory, static random access memory (SRAM), etc.), and a data storage device 518, which communicate with each other via a bus 530.

Processing device 502 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 may also be one or more special-purpose processing devices such as an application specific integrated circuit (ASIC), a field programmable gate array (FPGA), a digital signal processor (DSP), network processor, or the like. The processing device 502 may be configured to execute instructions 526 for performing the operations and steps described herein.

The computer system 500 may further include a network interface device 508 to communicate over the network 520. The computer system 500 also may include a video display unit 510 (e.g., a liquid crystal display (LCD) or a cathode ray tube (CRT)), an alphanumeric input device 512 (e.g., a keyboard), a cursor control device 514 (e.g., a mouse), a graphics processing unit 522, a signal generation device 516 (e.g., a speaker), graphics processing unit 522, video processing unit 528, and audio processing unit 532.

The data storage device 518 may include a machine-readable storage medium 524 (also known as a non-transitory computer-readable medium) on which is stored one or more sets of instructions 526 or software embodying any one or more of the methodologies or functions described herein. The instructions 526 may also reside, completely or at least partially, within the main memory 504 and/or within the processing device 502 during execution thereof by the computer system 500, the main memory 504 and the processing device 502 also constituting machine-readable storage media.

In some implementations, the instructions 526 include instructions to implement functionality corresponding to the present disclosure. While the machine-readable storage medium 524 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 502 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A circuit, comprising:
   a multiplexed voltage supply terminal;
   a plurality of chains of transistors comprising three or more chains of transistors, wherein the plurality of chains of transistors is used to multiplex between three or more supply voltages, wherein each chain of transistors comprises a plurality of transistors coupled in series, wherein each chain of transistors corresponds to a respective supply voltage that is desired to be multiplexed, wherein a first end terminal of each chain of transistors is coupled to the respective supply voltage, and wherein a second end terminal of each chain of transistors is coupled to the multiplexed voltage supply terminal; and a plurality of sets of level shifters, wherein each set of level shifters corresponds to a respective chain of transistors and is controlled by a respective select signal, and wherein each set of level shifters comprises:
  a first level shifter having an output terminal that outputs a voltage of the voltage supply or a ground voltage based on the respective select signal, and
  a second level shifter having an output terminal that outputs a voltage of the multiplexed voltage supply terminal or a ground voltage based on the respective select signal, wherein the multiplexed voltage supply terminal is coupled to a supply terminal of the second level shifter.

2. The circuit of claim 1, wherein an output terminal of the first level shifter is coupled with a gate of a first end transistor in the respective chain of transistors, and wherein an output terminal of the second level shifter is coupled with a gate of a second end transistor in the respective chain of transistors.

3. The circuit of claim 1, wherein body terminals of end transistors in each chain of transistors are coupled to respective end terminals of the chain of transistors.

4. The circuit of claim 1, wherein the plurality of chains of transistors comprise positive-type metal-oxide-semiconductor (PMOS) transistors.

5. The circuit of claim 1, wherein the plurality of chains of transistors comprise negative-type metal-oxide-semiconductor (NMOS) transistors.

6. The circuit of claim 1, wherein enabling the respective select signal causes transistors in the respective chain of transistors to turn on, and disabling the respective select signal causes at least one transistor in the respective chain of transistors to turn off.

7. The circuit of claim 1, wherein each chain of transistors comprises a first transistor and a second transistor, wherein a gate terminal of the first transistor is coupled with the output of the first level shifter, and wherein a gate terminal of the second transistor is coupled with the output of the second level shifter.

8. A method, comprising:
  providing a first plurality of gate voltages to transistors in a first chain of transistors in a plurality of chains of transistors comprising three or more chains of transistors, wherein the first plurality of gate voltages causes the transistors in the first chain of transistors to turn on, wherein the providing the first plurality of gate voltages comprises using a first plurality of level shifters to generate the first plurality of gate voltages based on a first select signal;
  providing a second plurality of gate voltages to transistors in a second chain of transistors in the plurality of chains of transistors, wherein the second plurality of gate voltages causes the transistors in the second chain of transistors to turn off, wherein the providing the second plurality of gate voltages comprises using a second plurality of level shifters to generate the second plurality of gate voltages based on a second select signal;
  wherein the plurality of chains of transistors is used to multiplex between three or more supply voltages, wherein each chain of transistors corresponds to a respective supply voltage that is desired to be multiplexed, wherein a first end terminal of each chain of transistors is coupled to the respective supply voltage, and wherein a second end terminal of each chain of transistors is coupled to a multiplexed voltage supply terminal, and wherein the voltage of the multiplexed voltage supply terminal is provided to a supply terminal of one level shifter in the first plurality of level shifters and a supply terminal of one level shifter in the second plurality of level shifters; and
  providing a voltage of the multiplexed voltage supply terminal to a voltage supply terminal of a circuit.

9. The method of claim 8, wherein body terminals of end transistors in each chain of transistors are coupled to respective end terminals of the chain of transistors.

10. The method of claim 8, wherein the plurality of chains of transistors comprise positive-type metal-oxide-semiconductor (PMOS) transistors.

11. The method of claim 8, wherein the plurality of chains of transistors comprise negative-type metal-oxide-semiconductor (NMOS) transistors.

12. An apparatus, comprising:
  a multiplexed voltage supply terminal;
  a plurality of chains of transistors comprising three or more chains of transistors, wherein the plurality of chains of transistors is used to multiplex between three or more supply voltages, wherein each chain of transistors comprises a plurality of transistors coupled in series, wherein each chain of transistors corresponds to a respective supply voltage that is desired to be multiplexed, wherein a first end terminal of each chain of transistors is coupled to the respective supply voltage, and wherein a second end terminal of each chain of transistors is coupled to the multiplexed voltage supply terminal; and
  a plurality of sets of level shifters, wherein each set of level shifters corresponds to a respective chain of transistors and is controlled by a respective select signal, and wherein each set of level shifters comprises:
    a first level shifter having an output terminal that outputs a voltage of the voltage supply or a ground voltage based on the respective select signal, and
    a second level shifter having an output terminal that outputs a voltage of the voltage supply terminal voltage or a ground voltage based on the respective select signal, wherein the multiplexed voltage supply terminal is coupled to a supply terminal of the second level shifter.

13. The apparatus of claim 12, wherein an output terminal of the first level shifter is coupled with a gate of a first end transistor in the respective chain of transistors, and wherein an output terminal of the second level shifter is coupled with a gate of a second end transistor in the respective chain of transistors.

14. The apparatus of claim 12, wherein body terminals of end transistors in each chain of transistors are coupled to respective end terminals of the chain of transistors.

15. The apparatus of claim 12, wherein the plurality of chains of transistors comprise positive-type metal-oxide-semiconductor (PMOS) transistors.

16. The apparatus of claim 12, wherein the plurality of chains of transistors comprise negative-type metal-oxide-semiconductor (NMOS) transistors.

17. The apparatus of claim 12, wherein enabling the respective select signal causes transistors in the respective chain of transistors to turn on, and disabling the respective select signal causes at least one transistor in the respective chain of transistors to turn off.

* * * * *